United States Patent
Moczygemba et al.

(10) Patent No.: US 8,841,540 B2
(45) Date of Patent: Sep. 23, 2014

(54) HIGH TEMPERATURE THERMOELECTRICS

(75) Inventors: Joshua E. Moczygemba, Wylie, TX (US); James L. Bierschenk, Rowlett, TX (US); Jeffrey W. Sharp, Murphy, TX (US)

(73) Assignee: Marlow Industries, Inc., Dallas, TX (US)

( * ) Notice: Subject to any disclaimer, the term of this patent is extended or adjusted under 35 U.S.C. 154(b) by 84 days.

(21) Appl. No.: 13/197,260

(22) Filed: Aug. 3, 2011

(65) Prior Publication Data

US 2013/0032189 A1    Feb. 7, 2013

(51) Int. Cl.
*H01L 35/08* (2006.01)
*H01L 35/04* (2006.01)
*B23K 11/11* (2006.01)
*B23K 11/16* (2006.01)
*H01L 35/18* (2006.01)
*B23K 26/22* (2006.01)
*B23K 1/00* (2006.01)

(52) U.S. Cl.
CPC .............. *H01L 35/08* (2013.01); *B23K 2201/38* (2013.01); *B23K 2001/12* (2013.01); *B23K 1/00* (2013.01); *H01L 35/04* (2013.01); *B23K 11/115* (2013.01); *B23K 11/16* (2013.01); *B23K 1/0016* (2013.01); *B23K 2201/40* (2013.01); *H01L 35/18* (2013.01); *B23K 26/22* (2013.01)
USPC ........ 136/224; 136/201; 136/212; 136/236.1; 136/240; 228/203; 219/118

(58) Field of Classification Search
CPC .......... H01L 35/00–35/34; B23K 1/00; B23K 1/0016; B23K 2001/00; B23K 2001/12; B23K 2201/38; B23K 2201/40
USPC ................................................... 136/200–242
See application file for complete search history.

(56) References Cited

U.S. PATENT DOCUMENTS

| | | | |
|---|---|---|---|
| 3,391,446 A | 7/1968 | Buttle et al. | |
| 3,650,844 A | 3/1972 | Kendall, Jr. et al. | 136/237 |
| 3,988,171 A | 10/1976 | Miller et al. | 136/237 |
| 5,064,476 A * | 11/1991 | Recine, Sr. | 136/201 |
| 5,171,372 A * | 12/1992 | Recine, Sr. | 136/203 |
| 5,650,904 A * | 7/1997 | Gilley et al. | 361/56 |
| 6,262,357 B1 | 7/2001 | Johnson et al. | 136/203 |
| 6,369,314 B1 * | 4/2002 | Nolas | 136/201 |

(Continued)

OTHER PUBLICATIONS

Kohlweiler, W., et al. "Brazing Aluminum." BrazeTec. Published online Aug. 2001, http://web.archive.org/web/20070810001717/ http://www.technicalmaterials.umicore.com/en/bt/brazingCenter/ aus_der_loetpraxis/aus_der_loetpraxis.htm and PDF at http:// www.technicalmaterials.umicore.com/en/bt/brazingCenter/aus_ der_loetpraxis/show_brazing_aluminium.pdf.*

(Continued)

*Primary Examiner* — James Lin
*Assistant Examiner* — Liesl C Baumann
(74) *Attorney, Agent, or Firm* — Baker Botts L.L.P.

(57) ABSTRACT

In accordance with one embodiment of the present disclosure, a thermoelectric device includes a plurality of thermoelectric elements that each include a diffusion barrier. The diffusion barrier includes a refractory metal. The thermoelectric device also includes a plurality of conductors coupled to the plurality of thermoelectric elements. The plurality of conductors include aluminum. In addition, the thermoelectric device includes at least one plate coupled to the plurality of thermoelectric elements using a braze. The braze includes aluminum.

20 Claims, 2 Drawing Sheets

(56) References Cited

U.S. PATENT DOCUMENTS

| | | | |
|---|---|---|---|
| 6,410,971 B1 | 6/2002 | Otey | 257/467 |
| 6,492,585 B1* | 12/2002 | Zamboni et al. | 136/201 |
| 6,660,925 B1* | 12/2003 | Sharp | 136/201 |
| 6,670,216 B2 | 12/2003 | Strauch | |
| 7,531,739 B1* | 5/2009 | Moczygemba | 136/201 |
| 2004/0079407 A1* | 4/2004 | Sharp | 136/236.1 |
| 2004/0261830 A1 | 12/2004 | Sharp et al. | 136/201 |
| 2006/0042675 A1* | 3/2006 | Tateyama et al. | 136/212 |
| 2006/0237396 A1 | 10/2006 | Buday | 219/119 |
| 2009/0211618 A1* | 8/2009 | Tanaka | 136/200 |
| 2010/0258156 A1 | 10/2010 | Inatomi et al. | 136/205 |

OTHER PUBLICATIONS

PCT, Notification of Transmittal of the International Search Report and the Written Opinion of the International Searching Authority, or the Declaration, International Application No. PCT/US 12/46602, 10 pages, Oct. 5, 2012.

* cited by examiner

HIGH TEMPERATURE THERMOELECTRICS

GOVERNMENT RIGHTS

A portion or all of this disclosure may have been made with Government support under government contract number TCS-236-36 awarded by the United States Department of Energy, and under government contract number W909MY09C0061 awarded by the United States Army of the United States Department of Defense. The Government may have certain rights in this disclosure.

TECHNICAL FIELD

This disclosure relates in general to thermoelectric devices, and more particularly to high temperature thermoelectrics.

BACKGROUND OF THE DISCLOSURE

The basic theory and operation of thermoelectric devices has been developed for many years. Presently available thermoelectric devices used for cooling typically include an array of thermocouples which operate in accordance with the Peltier effect. Thermoelectric devices may also be used for heating, power generation and temperature sensing.

Thermoelectric devices may be described as essentially small heat pumps which follow the laws of thermodynamics in the same manner as mechanical heat pumps, refrigerators, or any other apparatus used to transfer heat energy. A principal difference is that thermoelectric devices function with solid state electrical components (thermoelectric elements or thermocouples) as compared to more traditional mechanical/fluid heating and cooling components.

Thermoelectric materials such as alloys of $Bi_2Te_3$, PbTe and BiSb were developed thirty to forty years ago. More recently, semiconductor alloys such as SiGe have been used in the fabrication of thermoelectric devices. Typically, a thermoelectric device incorporates both a P-type semiconductor and an N-type semiconductor alloy as the thermoelectric materials.

As cooling applications progressively require thermoelectric devices to operate at higher temperatures, existing techniques have been unable to produce effective solutions.

SUMMARY OF THE DISCLOSURE

In some embodiments, certain disadvantages and problems associated with using thermoelectric devices in high temperature environments have been substantially reduced or eliminated.

In accordance with one embodiment of the present disclosure, a thermoelectric device includes at least one plate and a plurality of conductors formed on the at least one plate. The plurality of conductors includes aluminum. The thermoelectric device includes a plurality of thermoelectric elements that each include a diffusion barrier coupled to the plurality of conductors using a braze. The diffusion barrier includes a refractory metal. The braze includes aluminum.

In some embodiments, the refractory metal may include molybdenum. The at least one plate may include aluminum oxide or aluminum nitride. The braze may include aluminum silicon. The thermoelectric device may also include a lead. The lead may be resistance welded to the at least one plate.

In accordance with another embodiment of the present disclosure, a method of forming a thermoelectric generator includes applying a diffusion barrier to a plurality of thermoelectric elements. The diffusion barrier includes a refractory metal. The method also includes forming a plurality of conductors on at least one plate. The plurality of conductors include aluminum. In addition, the method includes coupling the plurality of conductors to the plurality of thermoelectric elements using a braze. The braze includes aluminum.

Technical advantages of certain embodiments of the present disclosure include enabling extended temperature operation superior to existing techniques. Some existing thermoelectric devices experience rapid degradation due to thermal stresses. Certain embodiments of the present disclosure provide for the accommodation of thermal expansion during operation.

Other technical advantages of the present disclosure will be readily apparent to one skilled in the art from the following figures, descriptions, and claims. Moreover, while specific advantages have been enumerated above, various embodiments may include all, some, or none of the enumerated advantages.

BRIEF DESCRIPTION OF THE DRAWINGS

For a more complete understanding of the present disclosure and its advantages, reference is now made to the following description, taken in conjunction with the accompanying drawings, in which.

DETAILED DESCRIPTION OF THE DISCLOSURE

Figure 1:
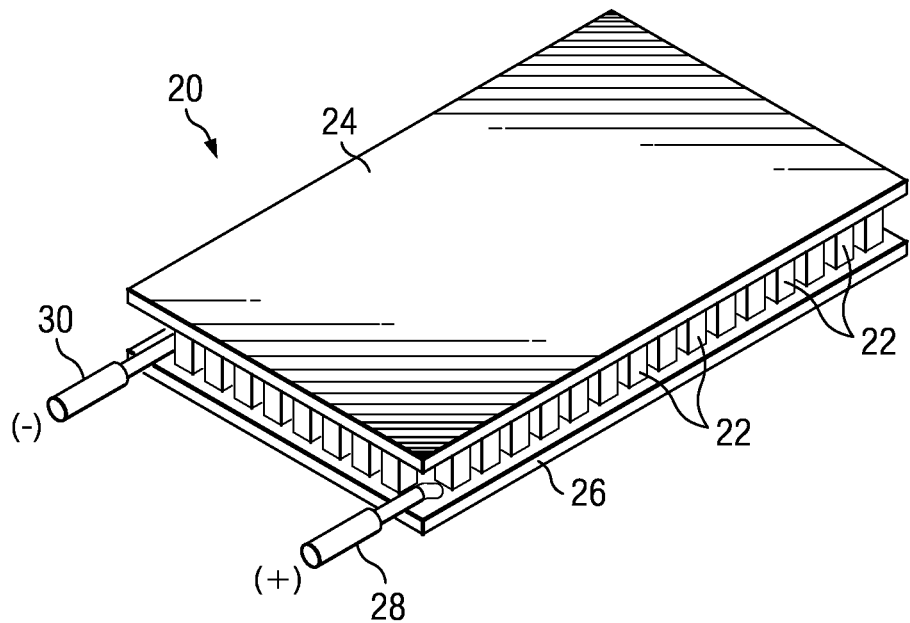
FIG. 1 illustrates one embodiment of a thermoelectric device including a plurality of thermoelectric elements disposed between a cold plate and a hot plate.

FIG. 1 illustrates one embodiment of a thermoelectric device 20 including a plurality of thermoelectric elements 22 disposed between a cold plate 24 and a hot plate 26. Electrical connections 28 and 30 are provided to allow thermoelectric device 20 to be electrically coupled with an appropriate source of DC electrical power or to allow thermoelectric device 20 to be electrically coupled to one or more devices that use, transform, or store power when thermoelectric device 20 operates as a generator.

Thermoelectric device 20 may be used as a heater, cooler, electrical power generator, and/or temperature sensor. If thermoelectric device 20 were designed to function as an electrical power generator, electrical connections 28 and 30 would represent the output terminals from such a power generator operating between hot and cold temperature sources.

Figure 2:
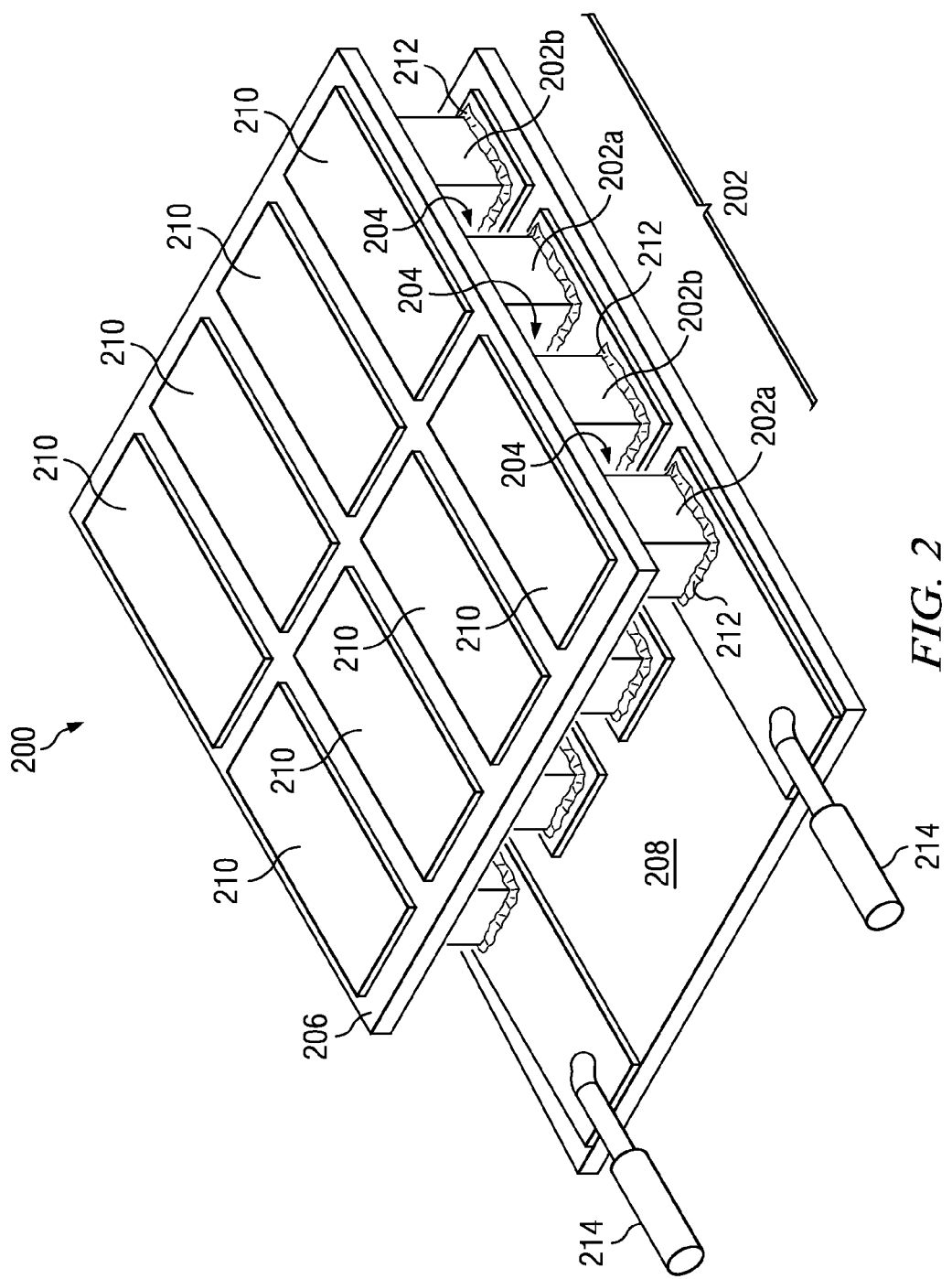
FIG. 2 illustrates one embodiment of a thermoelectric device capable of operating in high temperatures.

FIG. 2 illustrates one embodiment of thermoelectric device 200 capable of operating in high temperatures. This may be an example of how thermoelectric device 20 may be implemented. Thermoelectric device 200 may include thermoelectric elements 202 fabricated from dissimilar semiconductor materials such as N-type thermoelectric elements 202a and P-type thermoelectric elements 202b. Thermoelectric elements 202 are typically configured in a generally alternating N-type element to P-type element arrangement and typically include an air gap 204 disposed between adjacent N-type and P-type elements. In many thermoelectric devices, thermoelectric materials with dissimilar characteristics are connected electrically in series and thermally in parallel.

Examples of thermoelectric devices and methods of fabrication are shown in U.S. Pat. No. 5,064,476 titled Thermoelectric Cooler and Fabrication Method; U.S. Pat. No. 5,171, 372 titled Thermoelectric Cooler and Fabrication Method; and U.S. Pat. No. 5,576,512 entitled Thermoelectric Apparatus for Use With Multiple Power Sources and Method of Operation.

N-type semiconductor materials generally have more electrons than necessary to complete the associated crystal lattice structure. P-type semiconductor materials generally have fewer electrons than necessary to complete the associated crystal lattice structure. The "missing electrons" are sometimes referred to as "holes." The extra electrons and extra holes are sometimes referred to as "carriers." The extra electrons in N-type semiconductor materials and the extra holes in P-type semiconductor materials are the agents or carriers which transport or move heat energy between cold side or cold plate 206 and hot side or hot plate 208 through thermoelectric elements 200 when subject to a DC voltage potential. These same agents or carriers may generate electrical power when an appropriate temperature difference is present between cold side 206 and hot side 208. Leads 214 may be coupled to plate 208 in a manner that withstands high temperature environments, such as resistance welding, tungsten inert gas (TIG) welding, and laser welding.

In some embodiments, thermoelectric elements 202 may include high temperature thermoelectric material. Examples of high temperature thermoelectric materials include lead telluride (PbTe), lead germanium telluride (PbGeTe), TAGS alloys (such as $(GeTe)_{0.85}(AgSbTe2)_{0.15}$), bismuth telluride ($Bi_2Te_3$), and skutterudites.

In some embodiments, thermoelectric elements 202 may include a diffusion barrier that includes refractory metals (e.g., a metal with a melting point above 1,850° C.). Suitable refractory metals may include those that are metallurgically compatible with high temperature thermoelectric materials and metallurgically compatible with other components of thermoelectric device 200. For example, a molybdenum diffusion barrier may be used. This may be advantageous in that molybdenum may be metallurgically compatible with various aspects of thermoelectric device 200. For example, as further discussed below, thermoelectric device 200 may include an aluminum braze that is metallurgically compatible with a molybdenum diffusion barrier. Such a diffusion barrier may prevent or reduce the chance or occurrence of Kirkendall voiding in thermoelectric device 200. Other suitable examples of a diffusion barrier that has similar properties to molybdenum include tungsten and titanium.

In some embodiments, alternating thermoelectric elements 202 of N-type and P-type semiconductor materials may have their ends connected by electrical conductors 210. Conductors 210 may be metallizations formed on thermoelectric elements 202 and/or on the interior surfaces of plates 206 and 208. Conductors 210 may include aluminum. Ceramic materials may be included in plates 206 and 208 which define in part the cold side and hot side, respectively, of thermoelectric device 200. In some embodiments, the ceramic materials may provide electrical isolation from hot and cold side sources. Aluminum metallized ceramics may accommodate thermal stresses (i.e., due to high temperature exposure) of the ceramic/aluminum bond. Examples of suitable ceramic materials include aluminum oxide, aluminum nitride, and beryllium oxide.

In some embodiments, thermoelectric elements 202 may be coupled to plates 206 and 208 using medium 212. Medium 212 may include brazes and/or solders. For example, aluminum-based brazes and/or solders may be used, such as aluminum silicon (AlSi) braze family and/or zinc-aluminum (ZnAl) solder. In some embodiments, using such brazes and/or solders may provide for high temperature operation and allow for flexible joints. Kirkendall voiding may be prevented or reduced.

In some embodiments, using one or more of the configurations discussed above, thermoelectric device 200 may be suitable as a fixed-joint, high temperature thermoelectric generator that is capable of being used in high temperature applications. For example, a thermoelectric generator built using skutterudite thermoelectric elements that include a molybdenum diffusion barrier, conductors formed by aluminum metallizations, and aluminum based brazes may result in a device that can operate with at least one of its plates (such as plates 206 or 208) at a temperature greater than 500 degrees Celsius. As another example, a thermoelectric generator built using bismuth telluride thermoelectric elements that include a molybdenum diffusion barrier, conductors formed by aluminum metallization, and zinc-aluminum (ZnAl) solder may result in a device that can operate with at least one of its plates (such as plates 206 or 208) at a temperature greater than 300 degrees Celsius.

Figure 3:
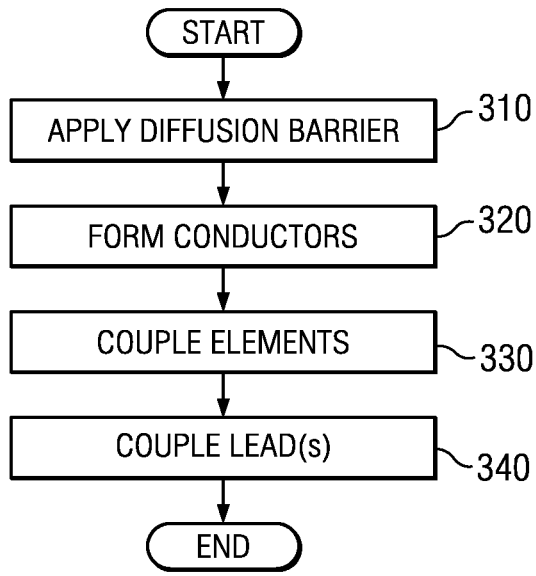
FIG. 3 is a flowchart illustrating one embodiment of forming a thermoelectric device.

FIG. 3 is a flowchart illustrating one embodiment of forming an thermoelectric device. For example, the steps illustrated in FIG. 3 may be used to form a thermoelectric generator. In general, the steps illustrated in FIG. 3 may be combined, modified, or deleted where appropriate, and additional steps may also be added to the example operation. Furthermore, the described steps may be performed in any suitable order.

At step 310, in some embodiments, a diffusion barrier may be applied to one or more thermoelectric elements. The diffusion barrier may be or include refractory metals, such as molybdenum, tungsten, and titanium. For example, a molybdenum diffusion barrier metallization may be applied at this step.

At step 320, in some embodiments, conductors may be formed. The conductors may be metallizations formed on the thermoelectric elements and/or formed on plates (e.g., on the interior surfaces of the plates). The plates may be ceramic plates. The conductors may be formed of aluminum.

At step 330, in some embodiments, plates may be coupled to the thermoelectric elements. For example, the thermoelectric elements may be coupled to the interior surfaces of two plates where conductors have been formed (e.g., at step 320) such that the thermoelectric elements may be disposed between the two plates. The thermoelectric elements may be coupled to conductors on the plates such that an N-type thermoelectric element is coupled to a P-type thermoelectric element. The plates may be coupled to the thermoelectric elements using brazes and/or solders. For example, aluminum-based brazes and/or solders may be used, such as aluminum silicon (AlSi) braze family and/or zinc-aluminum (ZnAl) solder.

At step 340, in some embodiments, leads may be coupled to at least one of the plates. This may be performed using resistance welding, tungsten inert gas (TIG) welding, or laser welding. The leads may be coupled such that electricity generated by the thermoelectric device may be sent through the leads to another device. As another example, the leads may be coupled such that electricity may be applied to the thermoelectric device.

Although the present disclosure has been described with several embodiments, a myriad of changes, variations, alterations, transformations, and modifications may be suggested to one skilled in the art, and it is intended that the present disclosure encompass such changes, variations, alterations, transformations, and modifications as fall within the scope of the appended claims.

What is claimed is:

1. A thermoelectric device comprising:
   a first plate comprising a first plurality of conductors, the first plurality of conductors consisting essentially of aluminum;
   a second plate comprising a second plurality of conductors, the second plurality of conductors consisting essentially of aluminum;
   a plurality of thermoelectric elements situated between the first plate and the second plate, the plurality of thermoelectric elements coupled to the first plurality of conductors and the second plurality of conductors; and
   a plurality of brazes comprising aluminum, the plurality of brazes situated at interfaces between the plurality of thermoelectric elements and the first plurality of conductors and situated at interfaces between the plurality of thermoelectric elements and the second plurality of conductors, the plurality of brazes comprising a first plurality of brazes and a second plurality of brazes, the first plurality of brazes in physical contact with the first plurality of conductors and the plurality of thermoelectric elements, the second plurality of brazes in physical contact with the second plurality of conductors and with the plurality of thermoelectric elements.

2. The thermoelectric device of claim 1 wherein the plurality of thermoelectric elements comprises a diffusion barrier, the diffusion barrier comprising molybdenum.

3. The thermoelectric device of claim 1 wherein the first plate and the second plate comprise aluminum oxide or aluminum nitride.

4. The thermoelectric device of claim 1 wherein the plurality of brazes comprise aluminum silicon.

5. The thermoelectric device of claim 1 further comprising a lead, the lead resistance welded to the first plate.

6. The thermoelectric device of claim 1 wherein the plurality of thermoelectric elements comprise skutterudite.

7. The thermoelectric device of claim 1, wherein the thermoelectric device is a thermoelectric generator.

8. A method of forming a thermoelectric generator, comprising:
   forming a first plurality of conductors on a first plate, the first plurality of conductors consisting essentially of aluminum;
   forming a second plurality of conductors on a second plate, the second plurality of conductors consisting essentially of aluminum;
   situating a plurality of thermoelectric elements between the first plate and the second plate;
   coupling the first plurality of conductors and the second plurality of conductors to the plurality of thermoelectric elements; and
   applying a plurality of brazes at interfaces between the plurality of thermoelectric elements and the first plurality of conductors and at interfaces between the plurality of thermoelectric elements and the second plurality of conductors, the plurality of brazes comprising aluminum, the plurality of brazes comprising a first plurality of brazes and a second plurality of brazes, the first plurality of brazes in physical contact with the first plurality of conductors and the plurality of thermoelectric elements, the second plurality of brazes in physical contact with the second plurality of conductors and with the plurality of thermoelectric elements.

9. The method of claim 8 further comprising applying a diffusion barrier to the plurality of thermoelectric elements, the diffusion barrier comprising molybdenum.

10. The method of claim 8 wherein the first plate and the second plate comprise aluminum oxide or aluminum nitride.

11. The method of claim 8 wherein the plurality of brazes comprise aluminum silicon.

12. The method of claim 8 further comprising resistance welding a lead to the first plate.

13. The method of claim 8 wherein the plurality of thermoelectric elements comprise skutterudite.

14. A thermoelectric generator comprising:
   a first plate comprising a first plurality of conductors, the first plurality of conductors consisting essentially of aluminum;
   a second plate comprising a second plurality of conductors, the second plurality of conductors consisting essentially of aluminum;
   a plurality of P-type and N-type thermoelectric elements situated between the first plate and the second plate, the plurality of thermoelectric elements coupled to the first plurality of conductors and the second plurality of conductors;
   a plurality of brazes comprising aluminum, the plurality of brazes situated at interfaces between the plurality of thermoelectric elements and the first plurality of conductors and situated at interfaces between the plurality of thermoelectric elements and the second plurality of conductors, the plurality of brazes comprising a first plurality of brazes and a second plurality of brazes, the first plurality of brazes in physical contact with the first plurality of conductors and the plurality of thermoelectric elements, the second plurality of brazes in physical contact with the second plurality of conductors and with the plurality of thermoelectric elements; and
   wherein the thermoelectric generator is configured to operate while the second plate is at a temperature above 300 degrees Celsius.

15. The thermoelectric generator of claim 14 wherein the plurality of thermoelectric elements comprises a diffusion barrier, the diffusion barrier comprising molybdenum.

16. The thermoelectric generator of claim 14 wherein the first plate and the second plate comprise aluminum oxide or aluminum nitride.

17. The thermoelectric generator of claim 14 wherein the plurality of brazes comprises aluminum silicon.

18. The thermoelectric generator of claim 14 further comprising a lead, the lead resistance welded to the first plate.

19. The thermoelectric generator of claim 14 wherein the plurality of thermoelectric elements comprise skutterudite.

20. The thermoelectric generator of claim 14, wherein the thermoelectric generator is configured to operate while the second plate is at a temperature above 500 degrees Celsius.

* * * * *